United States Patent
Chen et al.

(10) Patent No.: US 7,402,870 B2
(45) Date of Patent: Jul. 22, 2008

(54) ULTRA SHALLOW JUNCTION FORMATION BY EPITAXIAL INTERFACE LIMITED DIFFUSION

(75) Inventors: Huajie Chen, Danbury, CT (US); Omer H. Dokumaci, Wappingers Falls, NY (US); Oleg G. Gluschenkov, Poughkeepsie, NY (US); Werner A. Rausch, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/711,899

(22) Filed: Oct. 12, 2004

(65) Prior Publication Data
US 2006/0076627 A1    Apr. 13, 2006

(51) Int. Cl.
*H01L 29/76* (2006.01)
(52) U.S. Cl. ..................... 257/368; 257/288
(58) Field of Classification Search ................. 257/368, 257/288
See application file for complete search history.

(56) References Cited

U.S. PATENT DOCUMENTS

| | | | | |
|---|---|---|---|---|
| 4,863,878 A * | 9/1989 | Hite et al. | ... | 438/162 |
| 6,020,244 A * | 2/2000 | Thompson et al. | ... | 438/302 |
| 2004/0135210 A1 * | 7/2004 | Noguchi et al. | ... | 257/368 |

* cited by examiner

*Primary Examiner*—Long Pham
(74) *Attorney, Agent, or Firm*—Gibb & Rahman, LLC; Todd M. C. Li, Esq.

(57) ABSTRACT

A method of forming a field effect transistor creates shallower and sharper junctions, while maximizing dopant activation in processes that are consistent with current manufacturing techniques. More specifically, the invention increases the oxygen content of the top surface of a silicon substrate. The top surface of the silicon substrate is preferably cleaned before increasing the oxygen content of the top surface of the silicon substrate. The oxygen content of the top surface of the silicon substrate is higher than other portions of the silicon substrate, but below an amount that would prevent epitaxial growth. This allows the invention to epitaxially grow a silicon layer on the top surface of the silicon substrate. Further, the increased oxygen content substantially limits dopants within the epitaxial silicon layer from moving into the silicon substrate.

11 Claims, 5 Drawing Sheets

ULTRA SHALLOW JUNCTION FORMATION BY EPITAXIAL INTERFACE LIMITED DIFFUSION

BACKGROUND OF INVENTION

The present invention generally relates to forming field effect transistors and more specifically to the creation of shallower and sharper junctions, while maximizing dopant activation in processes that increase the oxygen content of the top surface of a silicon substrate before epitaxially growing a silicon layer on the silicon substrate, where the increased oxygen content substantially limits dopants within the epitaxial silicon layer from moving into the silicon substrate.

As devices are scaled to smaller and smaller dimensions, shallower and sharper junctions are needed in transistors to control short channel effects and series resistance. The ability to reduce the oxide thickness (scale the oxide) is becoming more difficult in field effect transistor (FETs) and other similar integrated circuit design technologies. As it becomes more difficult to scale the oxide, it becomes more important to reduce the junction depth and increase junction sharpness. However, it is becoming more difficult to obtain shallower and sharper junctions with ion implantation and rapid thermal annealing as the devices become smaller. Therefore, there is a need for new methodologies and structures that create shallower and sharper junctions while maximizing dopant activation in processes that are consistent with current manufacturing techniques.

SUMMARY OF INVENTION

The invention presents a beneficial method of forming a field effect transistor that creates shallower and sharper junctions, while maximizing dopant activation in processes that are consistent with current manufacturing techniques. More specifically, the invention increases the oxygen content of the top surface of a silicon substrate. The top surface of the silicon substrate is preferably cleaned before increasing the oxygen content. The oxygen content of the top surface of the silicon substrate is higher than other portions of the silicon substrate, but below an amount that would prevent epitaxial growth. This allows the invention to epitaxially grow a silicon layer on the top surface of the silicon substrate. Further, the increased oxygen content substantially limits dopants within the epitaxial silicon layer from moving into the silicon substrate.

Other processes are performed to complete the transistor structure. For example, isolation regions are also formed in the silicon layer. A gate stack is formed on the epitaxial silicon layer and dopants are delivered into regions of the epitaxial silicon layer not protected by the gate stack to form source and drain regions in the epitaxial silicon layer. The gate stack can be formed by patterning a gate conductor on the epitaxial silicon layer and forming sidewall spacers on the gate conductor. The process of delivering the dopants can comprise either implanting the dopants or diffusing the dopants. The silicon substrate and the transistor are annealed to activate the dopants.

In a different embodiment, the gate stacks are formed before the epitaxial layer is grown. In this process, the invention first forms a gate stack on a silicon substrate and then etches the top surface of the silicon substrate not protected by the gate stack to reduce the height of the top surface below the bottom of the gate stack. The process of etching the top surface of the silicon substrate undercuts the silicon substrate below the gate stack such that regions of the gate stack overhang the top surface of the silicon substrate. Thus, in this embodiment, the silicon substrate includes a column portion extending through the epitaxial silicon layer, where such a column portion is centered below the gate conductor.

Then, the invention increases the oxygen content of the top surface of the silicon substrate. Again, the oxygen content of the top surface of the silicon substrate is higher than the remaining portions of the silicon substrate; however, the oxygen content of the top surface of the silicon substrate is below an amount that would prevent epitaxial growth. As in the previous embodiment, the invention can then epitaxially grow a silicon layer on the top surface of the silicon substrate selectively.

The invention can either dope the epitaxial silicon layer after it is grown or can grow an in-situ doped epitaxial silicon layer. Further, the invention can grow multiple epitaxial silicon layers. For example, the invention can first grow an in-situ doped epitaxial silicon halo layer on the top of the silicon substrate, and then epitaxially grow an in-situ doped epitaxial silicon source/drain layer on the epitaxial silicon halo layer. The epitaxial silicon halo layer has the opposite doping of the epitaxial silicon source/drain layer. For in-situ doped epitaxy, NFETs and PFETs need to be grown separately, by ways of covering each of them with dielectric layer while growing in-situ doped Si on the other type of FETs. The recessing of the silicon, increasing of oxygen on top of the silicon, and then in-situ doping of the epitaxy can be limited to the PFETs, where the dopant diffusion is more severe.

Thus, the inventive field effect transistor is beneficial because the top surface of the silicon substrate has an increased oxygen content when compared to other portions of the silicon substrate. Again, the oxygen content of the top surface of the silicon substrate is below an amount that would prevent epitaxial growth. The source/drain and halo dopants are substantially limited to the epitaxial silicon layer, because the increased oxygen content substantially limits dopants within the epitaxial silicon layer from moving into the silicon substrate either during the process of implementing the dopants or during the subsequent annealing process.

These, and other, aspects and objects of the present invention will be better appreciated and understood when considered in conjunction with the following description and the accompanying drawings. It should be understood, however, that the following description, while indicating preferred embodiments of the present invention and numerous specific details thereof, is given by way of illustration and not of limitation. Many changes and modifications may be made within the scope of the present invention without departing from the spirit thereof, and the invention includes all such modifications.

BRIEF DESCRIPTION OF DRAWINGS

The invention will be better understood from the following detailed description with reference to the drawings, in which.

DETAILED DESCRIPTION

Figure 1:
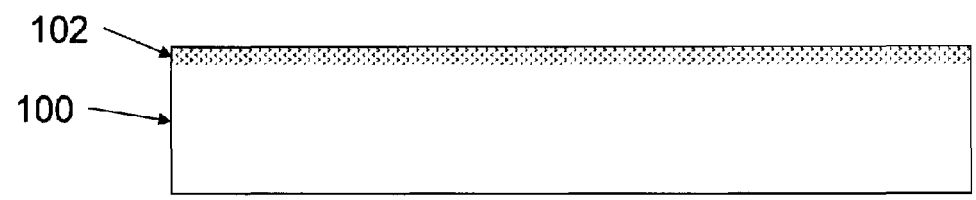
FIG. 1 is a schematic cross-sectional diagram of a partially completed transistor according to the invention.

The present invention and the various features and advantageous details thereof are explained more fully with reference to the nonlimiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the present invention. The examples used herein are intended merely to facilitate an understanding of ways in which the invention may be practiced and to further enable those of skill in the art to practice the invention. Accordingly, the examples should not be construed as limiting the scope of the invention.

As mentioned above, the invention presents a beneficial method of forming a field effect transistor that creates shallower and sharper junctions, while maximizing dopant activation in processes that are consistent with current manufacturing techniques. As shown in FIG. 1, the invention begins with a silicon substrate 100 that is preferably a single crystal silicon that can be appropriately doped into a semiconductor. The substrate can also be SOI, SiGe, strained silicon, or a combination thereof. The channel region can be doped anytime before the gate stack formation.

The invention increases the oxygen content of the top surface 102 of the silicon substrate 100. The top surface 102 of the silicon substrate 100 is preferably cleaned before increasing the oxygen content of the top surface 102 of the silicon substrate 100. The top surface 102 of silicon substrate 100 can be considered to be a separate layer; however, it is better to think of the top surface 102 as a region within the silicon substrate 100 that has a higher oxygen content than the remainder of the silicon substrate 100. For purposes of this disclosure the "top surface" 102 comprises less than the top 50% of the substrate 100, and preferably less than the top 10% of the substrate 100, and can comprise less than the top 1% of the substrate 100. One important point to note is that, while the oxygen content of the top surface 102 of the silicon substrate 100 is higher than other portions of the silicon substrate 100, the amount of oxygen within the top surface 102 is below an amount that would prevent epitaxial growth. A truly separate oxide layer would prevent an epitaxial growth process from being performed on the silicon substrate 100.

One way to obtain an increased oxygen region is to implant oxygen ions on top of the silicon substrate 100 and then anneal the substrate. The energy of the oxygen ions can range from about 0.1 keV to about 20 keV and the dose can range from about $1 \times 10^{15}$ cm$^{-2}$ to about $1 \times 10^{17}$ cm$^{-2}$, for example. The annealing method can be rapid thermal annealing (RTA), spike annealing, flash lamp annealing, laser annealing, etc. Annealing temperature can range from about 900° C. to about 1400° C., for example, whereas annealing time can range from microseconds to about a minute, for example. This is then followed by, for example, wet chemical cleaning and an HF etch to remove native oxide on the silicon surface.

Alternatively, increased oxygen can be obtained by growing a sub-monolayer region of oxide on the silicon substrate 100. The silicon surface is first cleaned by, for example, wet chemical cleaning to remove particles and organics, followed by HF etch to remove native oxide. Then, the silicon surface can be treated by various chemical solutions to grow a sub-monolayer region of oxide, for example, by flowing a slow oxidizing solution such as deionized (DI) water. The target amount of oxygen on the surface can be, for example, about $1 \times 10^{13}$ to about $3 \times 10^{14}$ cm$^{-2}$, and preferably about $5 \times 10^{13}$ to about $1.5 \times 10^{14}$ cm$^{-2}$. The increase of oxygen can also be achieved by leaving the wafers in an oxygen containing ambient for 5-24 hours, or treating the wafer in an epitaxy chamber with controlled oxygen or water vapor partial pressure.

Figure 2:
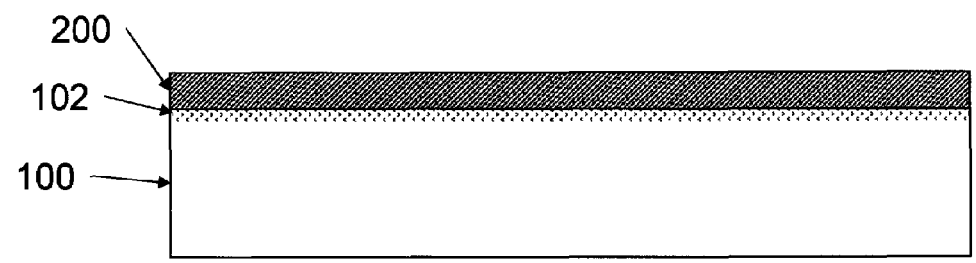
FIG. 2 is a schematic cross-sectional diagram of a partially completed transistor according to the invention.

By restricting the increase in the oxygen content to a level below that which would form a separate distinct layer as discussed above, this allows the invention to epitaxially grow a silicon layer 200 on the top surface 102 of the silicon substrate 100, as shown in FIG. 2. The thickness of the epitaxial silicon can range from about 3 nm to about 30 nm, for example.

Figure 3:
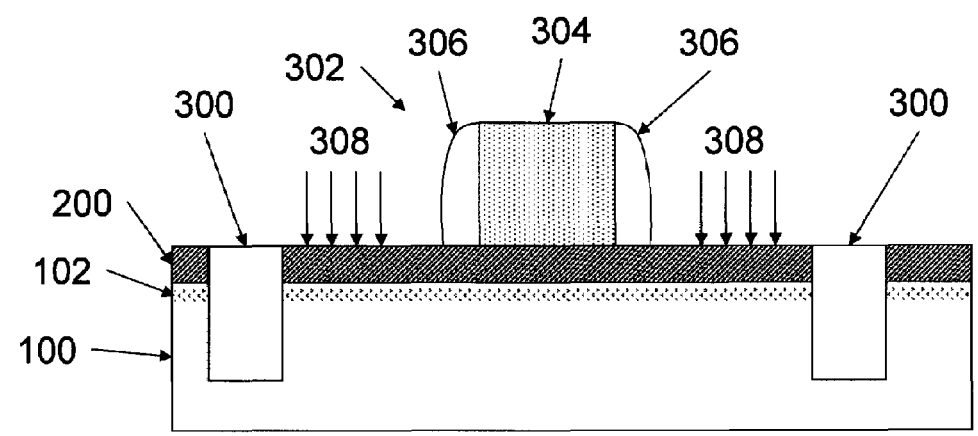
FIG. 3 is a schematic cross-sectional diagram of a partially completed transistor according to the invention.
Figure 4:
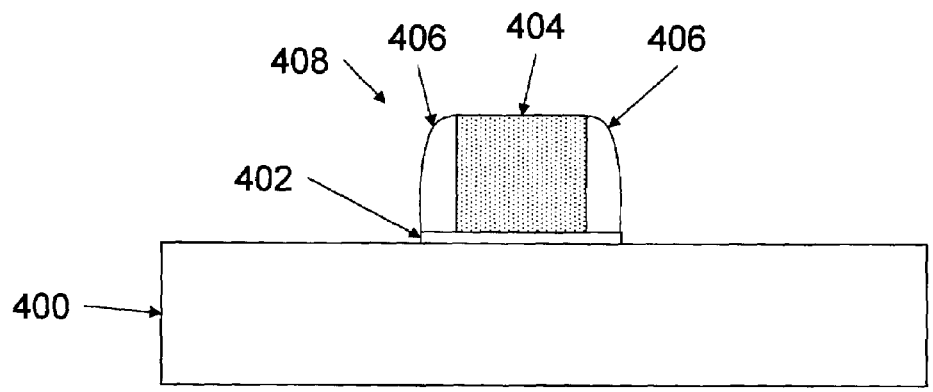
FIG. 4 is a schematic cross-sectional diagram of a partially completed transistor according to the invention.

As shown in FIG. 3, other processes are performed to complete the transistor structure. For example, isolation regions 300 are formed in the epitaxial silicon layer 200 and the silicon substrate 100 using conventional well-known processes. A gate stack 302 is formed on the epitaxial silicon layer 200 using conventional well-known processes. The gate stack 302 can be formed by patterning a gate conductor 304 on the epitaxial silicon layer 200 and forming sidewall spacers 306 on the gate conductor 304.

Dopants are delivered (arrows 308) into regions of the epitaxial silicon layer 200 not protected by the gate stack 302 to form source and drain regions and/or extensions in the epitaxial silicon layer 200 using conventional well-known processes. The regions of the epitaxial layer 200 below the gate stack 302 do not receive the impurity 308. The process of delivering the dopants can comprise, for example, either implanting the dopants or diffusing the dopants. For example, Arsenic (As) or Phosphorus can be used for NFET extensions or source drains and boron (B) or indium (In) can be used for NFET halos. For example, Boron or BF2 can be used for PFET extensions or source drains whereas As or P can be used for PFET halos. Implant energies for extensions and source drains can range from, for example, about 0.1 keV to about 20 keV, and implant doses for the same can range from, for example, about $1 \times 10^{14}$ cm$^{-2}$ to about $1 \times 10^{16}$ cm$^{-2}$. The energies in this invention are chosen such that the dopants are not implanted below the oxygen layer 102. The transistor can then be annealed to activate the dopants. The annealing method can be, for example, rapid thermal annealing (RTA), spike annealing, flash lamp annealing, laser annealing, etc. Annealing temperature can range from, for example, about 900° C. to about 1400° C., whereas annealing time can range from microseconds up to about a minute, for example. As mentioned above, the increased oxygen content 102 substantially limits dopants within the epitaxial silicon layer 200 from moving into the silicon substrate 100 during the subsequent annealing steps so that the junction depth is limited by the epitaxial silicon thickness. Thus, the invention obtains ultra-shallow junctions with high activation by controlling the epitaxial silicon thickness.

In a different embodiment, shown in FIGS. 4-7, the gate stack 408 is formed before the epitaxial layer 602 is grown. In this process, the invention first forms a gate oxide 402 on a substrate 400 using well-known processes. The invention then patterns the gate conductor 404 over the gate oxide 402 using well-known processes. Next, the sidewall spacers 406 are formed on sides of the gate conductor 404 using well-known processes. The exposed portions of the gate oxide 402 that are not protected by gate conductor 404 or the sidewall spacers 406 are then removed using one or more well-known selective removal processes.

Figure 5:
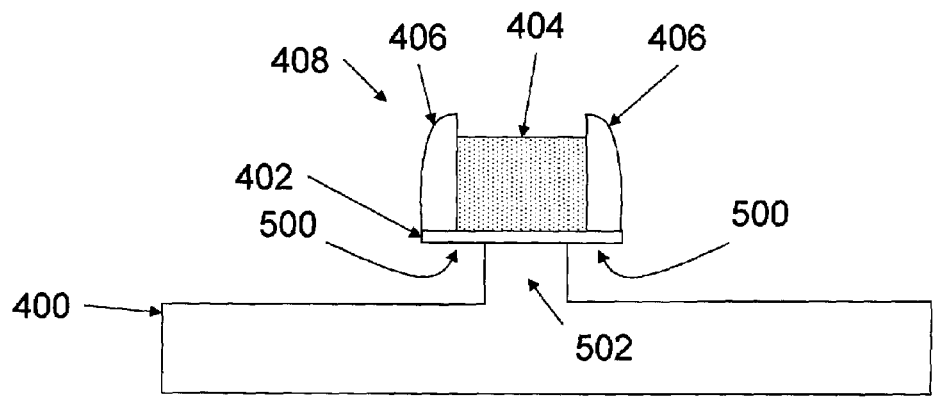
FIG. 5 is a schematic cross-sectional diagram of a partially completed transistor according to the invention.

In the next processing step, as shown in FIG. 5, the invention performs a selective silicon etch to remove a predetermined thickness of the top surface of the silicon substrate 400 not protected by the gate stack 408 to reduce the height of the top surface below the bottom of the gate stack 408. During the process of etching the top surface 600 of the silicon substrate 400, the silicon substrate 400 below the gate stack 408 is intentionally undercut such that regions 500 of the gate stack 408 overhang the top surface of the silicon substrate 400. This process also may reduce the height of the gate conductor 404 somewhat if the gate conductor is polysilicon, but this can be prevented by using a nitride or oxide cap on top of the gate if desired. Thus, in this embodiment, the silicon substrate 400 includes a column portion 502 centered below the gate conductor 404.

Figure 6:
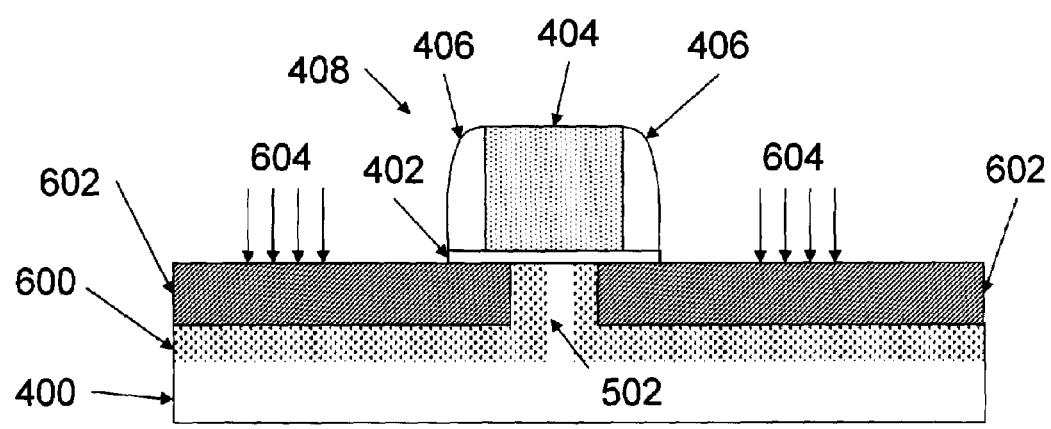
FIG. 6 is a schematic cross-sectional diagram of a partially completed transistor according to the invention.

Then, as shown in FIG. 6, the invention increases the oxygen content of the top surface 600 of the silicon substrate 400 as described above. Again, the oxygen content of the top surface 600 of the silicon substrate 400 is higher than the remaining portions of the silicon substrate 400; however, the oxygen content of the top surface 600 of the silicon substrate 400 is below an amount that would prevent epitaxial growth. As in the previous embodiment, the invention can then epitaxially grow a silicon layer 602 on the top surface 600 of the silicon substrate 400 in a selective manner. Thus, in this embodiment, the silicon substrate 400 includes a column portion 502 extending through the epitaxial silicon layer 602, where such a column portion 502 is centered below the gate conductor 404. The invention can either dope the epitaxial silicon layer 602 after it is grown (as shown by arrows 604) or can grow an in-situ doped epitaxial silicon layer 602.

Figure 7:
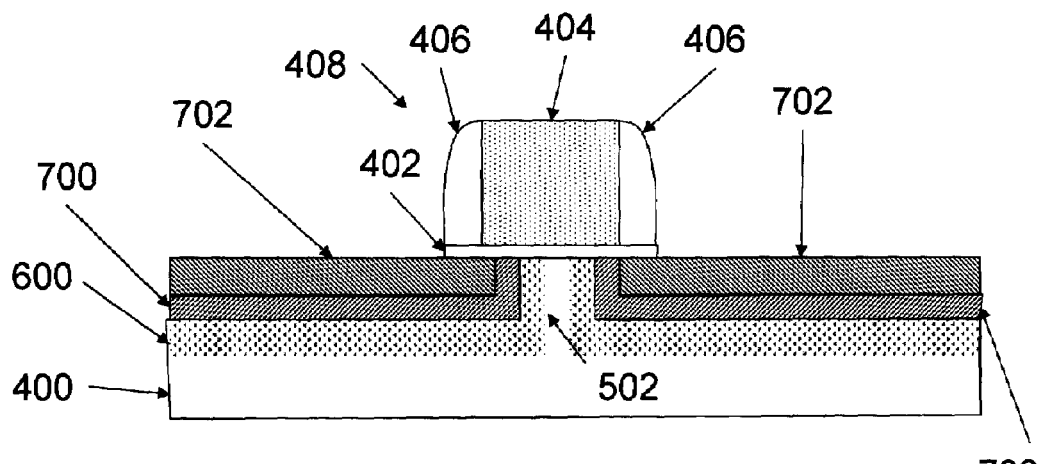
FIG. 7 is a schematic cross-sectional diagram of a partially completed transistor according to the invention.

Further, as shown in FIG. 7, the invention can grow multiple epitaxial silicon layers. For example, the invention can first grow an epitaxial silicon halo layer 700 on the top of the silicon substrate 400. This halo layer 700 can be deposited as a pre-doped (in-situ doped) layer, or can be doped directly after it is grown. After the halo layer is formed, a second oxygen-rich layer/surface can be created to further limit the junction depth of the extension or source/drain. Then an epitaxial silicon extension or source/drain layer 702 is grown on the epitaxial silicon halo layer 700. Again, this extension or source/drain layer 702 can be deposited as a pre-doped (in-situ doped) layer, or can be doped directly after it is grown. The epitaxial silicon halo layer 700 has the opposite doping of the epitaxial silicon source/drain layer 702.

For in-situ doped epitaxy, NFETs and PFETs need to be grown separately, by ways of covering each of them with a protective masking layer while selectively growing in-situ doped Si on the other type of FETs. The silicon recessing, increasing of oxygen on top of the silicon, and then in-situ doping of the epitaxy can also be performed only on PFETs, where the dopant diffusion is more severe if desired.

The epitaxial layer grown in the recessed area can also comprise $Si_{1-x}Ge_x$, $Si_{1-x-y}Ge_xC_y$, or $Si_{1-x}C_x$, intrinsic or in-situ doped. It is preferable to grow $Si_{1-x}Ge_x$ in PFETs, and Si or $Si_{1-x}C_x$ in NFETs; however, circuit designers make material selections based upon the special purpose and constraints of each different situation.

Figure 8:
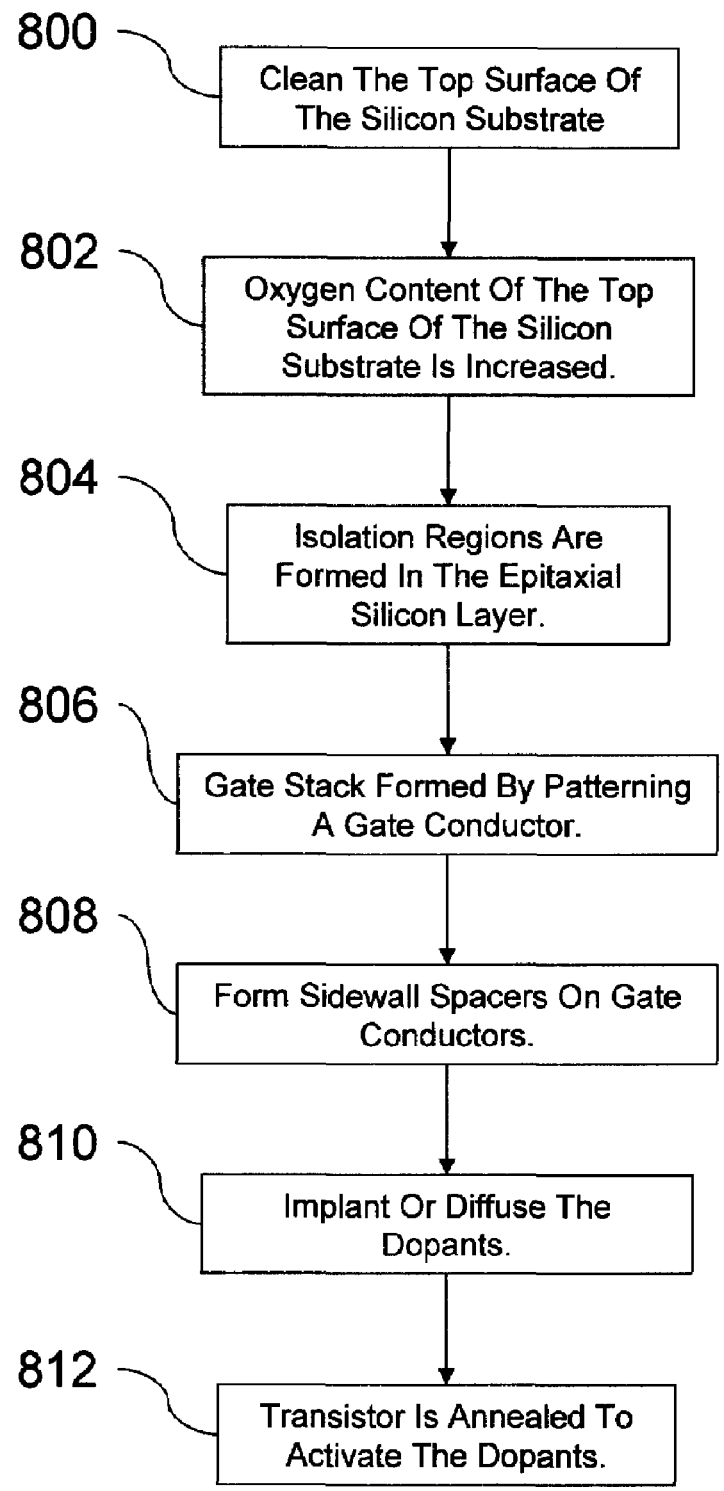
FIG. 8 is a flow diagram illustrating a preferred method of the invention.
Figure 9:
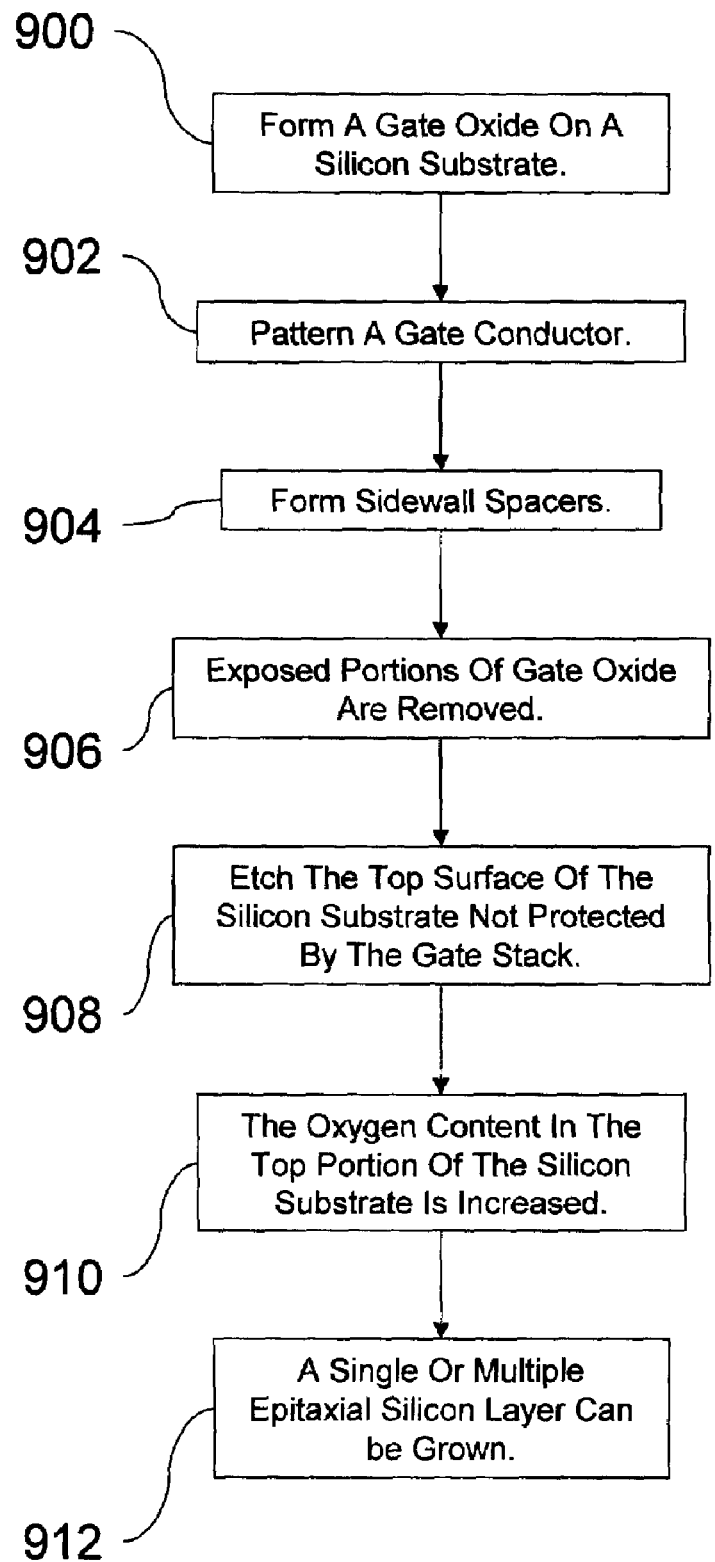
FIG. 9 is a flow diagram illustrating a preferred method of the invention.

The invention is shown in flowchart form in FIGS. 8 and 9. More specifically, the invention begins by cleaning the top surface of the silicon substrate in item 800. Next, in item 802 the oxygen content of the top surface of the silicon substrate in increased. Isolation regions are also formed in the silicon layer in item 804. The gate stack can be formed by patterning a gate dielectric and a gate conductor on the epitaxial silicon layer (806) and forming sidewall spacers around the gate conductor (808). The process of delivering the dopants (810) can comprise either implanting the dopants or diffusing the dopants. Alternatively, the epitaxial silicon layer can comprise an in-situ doped layer and item 810 can be skipped. The transistor is then annealed in item 812 to activate the dopants.

In a different embodiment, shown in FIG. 9, the gate stacks are formed before the epitaxial layer is grown. In this process, the invention first forms a gate dielectric on a silicon substrate (item 900). Following this, the invention patterns a gate conductor (item 902) and then forms sidewall spacers (item 904) along the sides of the gate conductor. The exposed portions of gate dielectric are then removed (item 906). Next, the invention etches the top surface of the silicon substrate not protected by the gate stack (item 908) to reduce the height of the top surface of the substrate below the bottom of the gate stack. In item 910, the invention increases the oxygen content in the top portion of the silicon substrate. Following this, in item 912, the invention can grow a single epitaxial silicon layer or multiple epitaxial silicon layers as described above. For multiple epitaxial growth, the oxygen content in the top portion of each epitaxial layer can be increased before the next epitaxial growth.

Thus, the inventive field effect transistor is beneficial because the top surface of the silicon substrate has an increased oxygen content when compared to other portions of the silicon substrate. Again, the oxygen content of the top surface of the silicon substrate is below an amount that would prevent epitaxial growth. The source/drain and halo dopants are substantially limited to the epitaxial silicon layer because the increased oxygen content substantially limits dopants within the epitaxial silicon layer from moving into the silicon substrate during the subsequent annealing processes. Thus, the invention provides a beneficial method of forming a field effect transistor that creates shallower and sharper junctions, while maximizing dopant activation in processes that are consistent with current manufacturing techniques.

While the invention has been described in terms of preferred embodiments, those skilled in the art will recognize that the invention can be practiced with modification within the spirit and scope of the appended claims.

What is claimed is:

1. A field effect transistor comprising:
   a silicon substrate;
   a gate stack on a top surface of said silicon substrate;
   a recess in said silicon substrate at said top surface adjacent said gate stack;
   an epitaxial silicon halo layer in said recess on said silicon substrate; and,
   an epitaxial silicon source/drain layer in said recess on said epitaxial silicon halo layer,
   wherein said silicon substrate comprises an oxidized portion bordering said recess directly adjacent said epitaxial silicon halo layer and wherein said oxidize portion has an oxygen content below an amount which would prevent epitaxial growth of said epitaxial silicon halo layer from said oxidized portion and further above an amount required to substantially limit dopants within said epitaxial silicon halo layer and said eptiaxial silicon source/drain layer from moving into said silicon substrate.

2. The field effect transistor in claim 1, wherein source/drain dopants are substantially limited to said epitaxial silicon source/drain layer.

3. The field effect transistor in claim 1, wherein said silicon substrate includes a column portion adjacent said epitaxial silicon halo layer and said epitaxial silicon source/drain layer, wherein said column portion is below said gate stack.

4. The field effect transistor in claim 2, wherein halo dopants are substantially limited to said epitaxial silicon halo layer and wherein said halo dopants are different from said source/drain dopants.

5. The field effect transistor in claim 1, further comprising isolation regions in said epitaxial silicon layer and said silicon substrate.

6. The field effect transistor in claim 1, wherein said top surface is essentially damage and native oxide free.

7. A field effect transistor comprising:
- a silicon substrate;
- a gate stack on a top surface of said silicon substrate;
- a recess in said silicon substrate at said top surface adjacent said gate stack; and
- an epitaxial silicon layer in said recess on said silicon substrate, grown from said silicon substrate and comprising dopants,
- wherein said silicon substrate comprises an oxidized portion bordering said recess directly adjacent said epitaxial silicon layer and wherein said oxidized portion has an oxygen content below an amount which would prevent epitaxial growth of said epitaxial silicon layer from said oxidized portion and further above an amount required to substantially limit said dopants within said epitaxial silicon layer from moving into said silicon substrate.

8. The field effect transistor in claim 7, wherein said silicon substrate includes a column portion adjacent said epitaxial silicon layer, wherein said column portion is below said gate stack.

9. The field effect transistor in claim 7, wherein said top surface is essentially damage and native oxide free.

10. The field effect transistor in claim 7, wherein said epitaxial silicon layer comprises an in-situ doped epitaxial silicon source/drain layer.

11. The field effect transistor in claim 7, further comprising isolation regions in said epitaxial silicon layer and said silicon substrate.

* * * * *